United States Patent [19]
Shirley

[11] Patent Number: 5,986,946
[45] Date of Patent: *Nov. 16, 1999

[54] METHOD AND APPARATUS FOR REDUCING ROW SHUT-OFF TIME IN AN INTERLEAVED-ROW MEMORY DEVICE

[75] Inventor: Brian Shirley, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/692,950

[22] Filed: Aug. 7, 1996

[51] Int. Cl.[6] ....................................................... G11C 8/00
[52] U.S. Cl. ................................ 365/189.11; 365/230.06; 365/230.08
[58] Field of Search ........................... 365/189.11, 230.06, 365/230.08, 189.05

[56] References Cited

U.S. PATENT DOCUMENTS

| | | | |
|---|---|---|---|
| 4,719,603 | 1/1988 | Shinagawa et al. | 365/230 |
| 5,297,104 | 3/1994 | Nakashima | 365/189.11 X |
| 5,311,481 | 5/1994 | Casper et al. | 365/230.06 |
| 5,400,283 | 3/1995 | Raad | 365/189.11 X |
| 5,416,747 | 5/1995 | Ohira | 365/189.11 X |
| 5,650,976 | 7/1997 | McLaury | 365/230.06 |

*Primary Examiner*—Do Hyun Yoo
*Attorney, Agent, or Firm*—Dickstein Shapiro Morin & Oshinsky, LLP

[57] ABSTRACT

A semiconductor memory includes two pull-down transistors provided at opposite ends of each word line of an interleaved-row array memory. Both of these transistors receive the same global phase signal and are therefore both rendered conductive when a word line is deselected. The two pull-down transistors, acting together, sink sufficient current to rapidly pull down each word line of an interleaved-row array DRAMs, thus minimizing shut-off time.

29 Claims, 4 Drawing Sheets

PRIOR ART

5,986,946

METHOD AND APPARATUS FOR REDUCING ROW SHUT-OFF TIME IN AN INTERLEAVED-ROW MEMORY DEVICE

BACKGROUND OF THE INVENTION

1. Field of the Invention

The present invention relates to a dynamic random access memory (DRAM), and more particularly to an apparatus and related method for reducing row-shut off time.

2. Description of the Prior Art

A conventional DRAM 10 is shown in FIG. 1 as including an array of memory cells 16 arranged in rows and columns. An individual memory cell 20, shown in FIG. 2, includes an access device, typically a transistor 26, coupled to a capacitor 28. Binary information is stored in memory cell 20 in the form of charge on capacitor 28. If capacitor 28 is charged, a logic level "1" is stored in the memory cell, and, if no charge is present, memory cell 20 stores a logic level "0".

As further shown in FIG. 2, the memory cell is located at the intersection of a word line 24 and data line 22. In particular, word line 24 is connected to the gate of transistor 26, while the drain is conneted to data line 22. In order to read information out of the memory cell, one of a plurality of row decoder circuits 14 (FIG. 1) drives a selected word line 24 high, thereby turning on transistor 26. Charge stored on capacitor 28 then passes from the source to the drain of transistor 26 and onto data line 22, where it is read out by column select circuitry 12 (see FIG. 1).

A word line is provided for each row of memory cells. Accordingly, for relatively large memories (e.g., 4 meg, 16 meg., 64 meg. etc.) a relatively long word line is required to connect to all of the memory cells of a given row. Due to layout considerations, it is frequently necessary to "interleave" the word lines in such arrays, wherein adjacent word lines are respectively serviced by row decoders and drivers positioned on opposite sides of the array.

A particular row decoder circuit, known as a "tree decoder" having a signal associated pull-down transistor for each word line, has been proposed. The tree decoder includes a plurality of series connected MOS transistors, the gates of which respectively receive a row address bit. An MOS transistor connected at one end of the tree decoder has its drain connected to receive a control signal or universal phase signal, and an MOS transistor connected at the other end of the tree decoder has its source connected to an inverter. The output of the inverter is connected to a word line, which is coupled to the drain of a pull-down transistor. The gate of the pull-down transistor is coupled to receive the universal phase signal and the source is connected to ground.

In order to select a particular word line, each of the address lines respectively connected to the gates of the MOS transistors of the tree decoder goes high, thereby rendering each MOS transistor conductive. The universal phase signal coupled to the selected decoder is made low, and this low voltage is passed through the MOS transistors of the tree decoder to the input of the inverter. The inverter then outputs a high voltage to drive the selected word line. At the same time, the low universal phase signal cuts off the pull-down transistor so that the word line is not shorted to ground.

After data has been read out from a memory cell connected to the selected word line, for example, the word line can be deselected by bringing the universal phase signal to a logic level high potential, rendering the pull-down transistor conductive and shorting the word line to ground, and thereby insuring that the output of the inverter is grounded.

In the conventional DRAM, word lines are typically made of polysilicon, which is relatively highly resistive. Thus, relatively large RC delays have been encountered in many DRAMs, requiring a long row turn-on time (i.e., the time to charge the word line up to a voltage that will render transistor 26 conductive), and row shut-off time (i.e., the time required to deselect a word line by discharging to ground). As a result, the overall speed of the DRAM is degraded.

In many applications, a long row turn-on time is not problematic. However, a long row shut-off time can adversely effect operation of the memory. One solution for reducing row-shut off time involves overlaying the polysilicon word line with a metal layer, which periodically contacts the polysilicon word line along its length. While effective in reducing the effective resistance of the word line, this approach is disadvantageous in that it requires additional processing or mask steps, which lengthen the manufacturing process and reduce yields.

The interleaved arrays described above can be fabricated to include shorter word lines having a shorter RC delay and shorter row shut-off times. Since the resistance of the word line is a function of its length, reducing the length of the word line reduces its resistance and, consequently, reduces the RC delay. However, by reducing word line length, additional row decoders are required, which increases chip size, thereby increasing manufacturing cost. Thus, it is desired to improve row shut-off time with no adverse impact on chip size.

SUMMARY OF THE INVENTION

In accordance with the present invention, a semiconductor memory device is provided including a plurality of memory cells arranged in a row, and a conductive wiring layer interconnecting the plurality of memory cells, the conductive wiring layer having first and second end portions. A first switching device is also provided having a first terminal connected to the first end portion of the conductive wiring layer, a second terminal coupled to a supply voltage, and a control terminal receiving a control signal. In addition, the semiconductor memory includes a second switching device having a first terminal connected to the second end portion of the conductive wiring layer, a second terminal coupled to the supply voltage, and a control terminal receiving the control signal. Further, when the control signal is set to a first voltage, the first and second switching device are cut off and the conductive wiring layer is charged to a predetermined potential, and when the control signal is set to a second voltage, the first and second switching devices are rendered conductive and the conductive wiring layer is discharged to the supply voltage.

Further in accordance with the present invention, a method for driving a word line in a semiconductor memory array is provided comprising a first step of coupling a first terminal of a first switching device to a first end portion of the word line and a second terminal of the first switching device to a supply voltage. An additional step of coupling a first terminal of a second switching device to a second end portion of the word line and a second terminal of the second switching device to the supply voltage. A control voltage having a first potential is supplied to a control terminal of the first switching device and a control terminal of the second switching device, thereby cutting off the first and second switching devices. A voltage is then supplied to the word line and, thereafter, the control signal having a second potential is supplied to the control terminals of the first and second switching devices, thereby discharging the word line to said supply voltage.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

The semiconductor memory in accordance with the present invention includes two switching devices, preferably pull-down transistors, provided at opposite ends of conductive lines, preferably each word line, of an interleaved-row array memory. Both of these transistors receive the same global phase signal and are therefore both rendered conductive when the word line is deselected. The two pull-down transistors acting together can sink significantly more current than just one acting alone. Accordingly, the word line potential in the present invention is pulled down much faster than in conventional interleaved-row array DRAMs.

Figure 1:
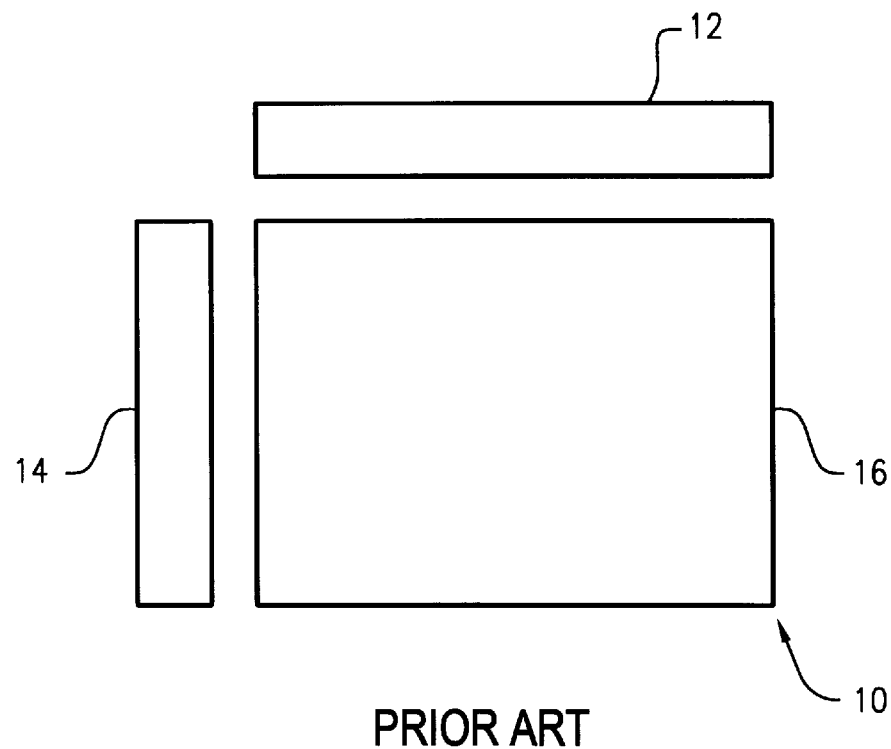
FIG. 1 is a block diagram illustrating a conventional DRAM.
Figure 2:
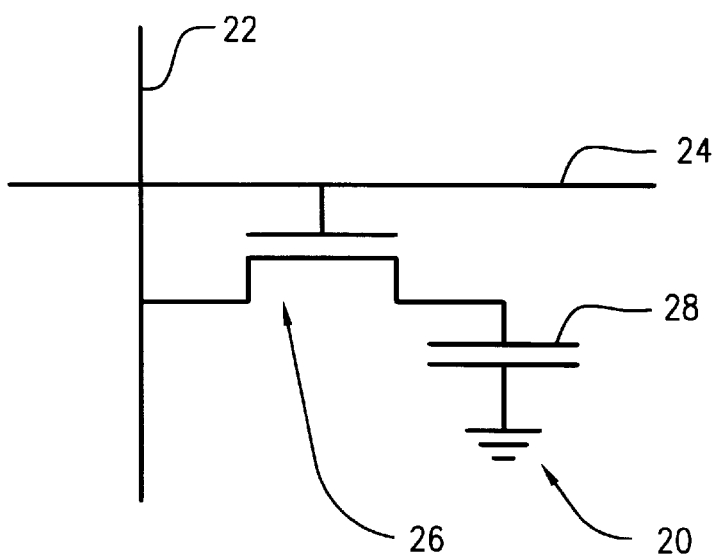
FIG. 2 is a schematic diagram illustrating a conventional DRAM memory cell.
Figure 3:
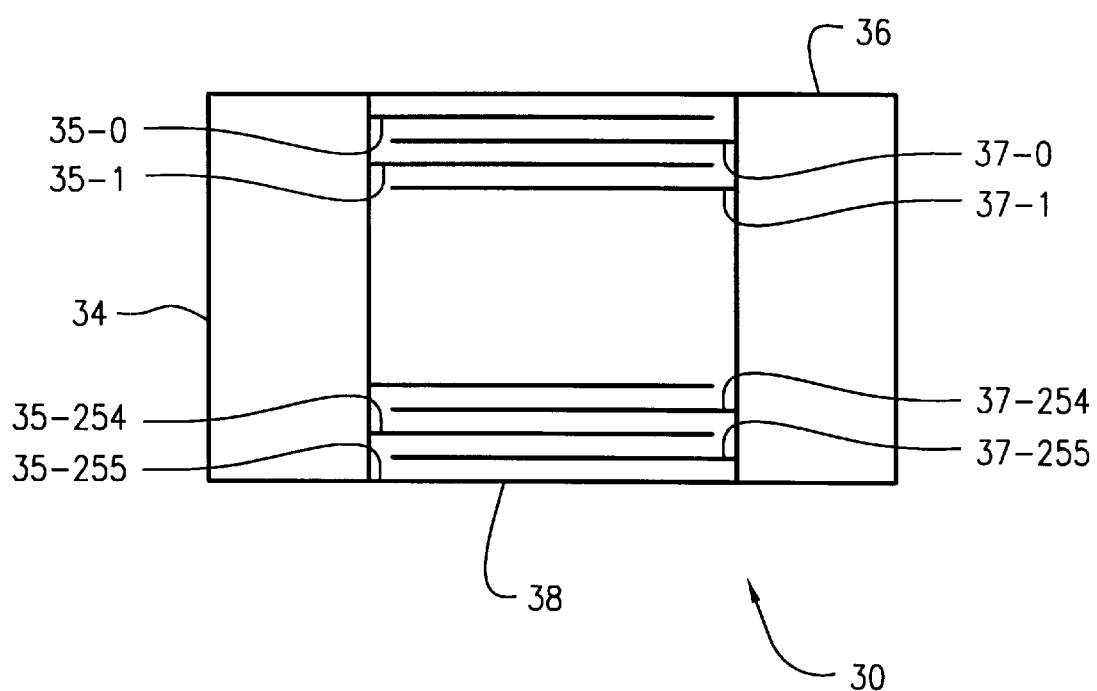
FIG. 3 is an block diagram illustrating a DRAM in accordance with the present invention.

FIG. 3 illustrates a block diagram of an interleaved-row array DRAM 30 in accordance with a preferred embodiment of the present invention. DRAM 30 preferably includes row decoder circuits 34 and 36 provided at opposite sides of memory cell block 38. Word lines 35-0 to 35-255, preferably including polysilicon, extend into memory cell block 38 from row decoders circuits 34, while word lines 37-0 to 37-255, also preferably including polysilicon, extend from row decoder circuits 36. Thus, row decoder circuits 34 and 36 are preferably each coupled to 256 word lines so that DRAM 30 includes a total of 512 word lines. It should be noted, however, that during normal operation, only one of these 512 word lines will be driven high (i.e., selected) at any given time.

Figure 4:
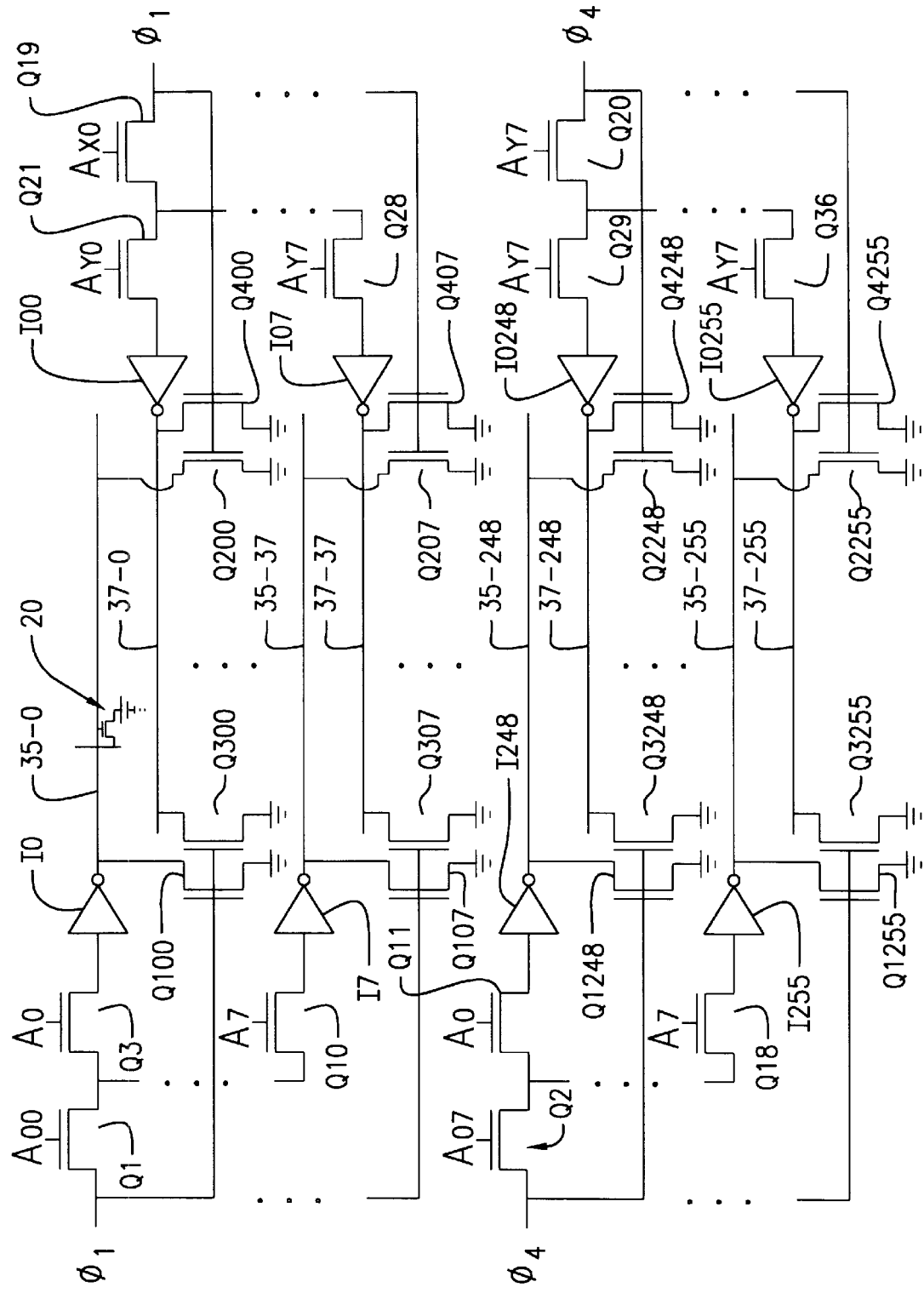
FIG. 4 is a detailed schematic illustrating a DRAM in accordance with the present invention.

FIG. 4 illustrates decoder circuits 34 and 36 of DRAM 30 in greater detail. Decoder circuit 34 provides three levels of decode for selecting one of 256 word lines 35-0 to 35-255. The first level of decode includes one of four control signals or universal phase signals $\phi_1$, $\phi_2$, $\phi_3$, and $\phi_4$ supplied to both decoder circuits 34 and 36. Each universal phase signal corresponds to a group of 64 word lines, which can be selected by driving a corresponding one of the four universal phase signals to a low logic level, while keeping the others at a high logic level or Vcc.

The universal phase signal is supplied to the drain electrodes of eight second level decode MOS transistors connected in parallel, each of which corresponding to a group of eight word lines. The gates of these eight MOS transistor are connected to one of eight respective address lines $A_{00}$ to $A_{07}$. In order to select one of the eight second level decode MOS transistors, i.e., select a group of eight word lines of the sixty four word lines designated by the universal phase signal, one of the address lines is set to a high logic level. By way of example, second level decode MOS transistor Q1, situated near the top of DRAM 30, has its gate coupled to address line $A_{00}$ and its drain connected to receive universal phase signal $\phi_1$. Near the bottom of DRAM 30, transistor Q2 receives universal phase signal $\phi_4$ at its drain and is connected to address line $A_{07}$ at its gate.

Each of the second level decode transistors has its source electrode coupled to the drains of eight third level decode MOS transistors. Since decoder circuits 34 preferably includes 32 second level decode transistors (8 for each universal phase signal), and eight third level decode transistors for each second level decode transistor, a total of 256 third level decode transistors are provided in decoder circuits 34. The gates of the third level decode transistors are each connected to one of an additional eight address lines $A_0$ to $A_7$ and their sources are respectively connected to inverters I0 to I255, which, in turn, are connected to respective word lines. Thus, for example, the source of transistor Q1 is connected to each of the drains of third level decode MOS transistors Q3 to Q10, and the source of transistor Q2 is connected to the drains of third level decode MOS transistors Q11 to Q18. In addition, the sources of transistors Q3 to Q10 are respectively connected to buffers or inverters I0 to I7, and the sources of transistors Q11 to Q18 are connected to inverters I248 to I255. Inverters I0 to I7, in turn, are connected to drive word lines 35-0 to 35-7, respectively, and inverters I248 to I255 drive word lines 35-248 to 35-255, respectively.

Decoder circuits 36 preferably have the same construction as decoder circuits 34. Namely, each receives the same four universal phase signals $\phi_1$, $\phi_2$, $\phi_3$, and $\phi_4$, and each includes the same number of second level decode transistors (e.g., transistors Q19 and Q20), as well as third level decode transistors (e.g., transistors Q21 to Q28 and transistors Q29 to Q36), buffers (I00 to I0255) and word lines (37-0 to 37-255). Each of these circuit elements is further configured in the same fashion as in decoder circuits 34. However, the address lines supplied to decoder circuit 36 carry address signals different than those carried by the address lines in decoder 34. For example, address lines $A_{X0}$ to $A_{X7}$ are respectively supplied to groups of eight second level decode MOS transistors, and address lines $A_{Y0}$ to $A_{Y7}$ are respectively supplied to the gates of groups of eight third level decode transistors.

As further shown in FIG. 4, each word line extending from decoder circuits 34, for example, is connected to the drain of a first pull-down MOS transistor or switch assembly (e.g., transistor Q100) at a first end portion adjustment the output of each inverter (e.g., inverter I0). In addition, a second pull-down transistor or switch assembly (e.g., transistor Q200) is provided for each word line having its drain connected to a second end portion of each word line adjacent decoder circuits 36. The gate of the first pull-down transistor is directly coupled to the universal phase signal input to decoder circuits 34, while the gate of the second pull-down transistor is also coupled to receive the same universal phase signal as the first pull-down transistor, but through the universal phase signal input to decoder circuits 34. The sources of the pull-down transistors are connected to a supply voltage, preferably ground.

As further shown in FIG. 4, first transistors Q100 to Q1255 and second transistors Q200 to Q2255 are provided for each of word lines 35-0 to 35-255, respectively. As noted above, each pair of first and second transistors for each word line receives the same universal phase signal.

Each of the word lines extending from decoder circuits 36 have a first pull-down transistor (e.g., transistor Q400) having its drain connected at a first end of the word line adjacent the inverter (e.g., inverter I00), and a second pull-down transistor (e.g., transistor Q300) at a second end portion adjacent decoder circuits 34. Remaining first (i.e., transistors Q401 to Q4255) and second pull-down transistors (Q301 to Q3255) associated with the word lines 37-1 to 37-255 are respectively connected in a similar fashion as the first and second transistors associated with the word lines 35-1 to 35-255.

The operation of DRAM 30 in accordance with the present invention will now be described. In particular, the operation will be discussed by way of example in selecting and deselecting word line 35-0 having a memory cell 20 coupled thereto. Initially, prior to selection, $\phi_1$ is at a high logic level and one or both of address lines $A_{00}$ and $A_0$ is at a low logic level potential or ground. Thus, transistors Q1 and Q3 are cutoff, while pull-down transistors Q100 and Q200 at opposite ends of word line 35-0 are turned-on, thereby pulling word line 35-0 to ground. When word line 35-0 is selected, however, $\phi_1$ is brought to a low logic level potential, thereby turning off transistors Q300 and Q200. At this point, word line 35-0 is no longer shorted to ground. Address lines $A_{00}$ and $A_0$ are set to a high logic level potential, thereby rendering transistors Q1 and Q3 conductive. The low logic level of $\phi_1$ is then passed to the input of inverter I0, which, in turn, outputs a high logic level potential to drive word line 35-0.

After information has been read out from memory cell 20, word line 35-0 can then be deselected. Thus, $\phi_1$ is brought to a high logic level potential. Since $\phi_1$ is supplied to both pull-down transistors Q100 and Q200 at opposite ends of word line 35-0, both transistors are rendered conductive simultaneously to pull the potential of word line 35-0 to ground. Since both transistors Q100 and Q200 act to sink current, row shut-off time is significantly reduced. Further inverter I0 receives the high logic level potential of universal phase signal $\phi_1$, and outputs a low logic level potential in response thereto. One or both of address lines $A_0$ and $A_{00}$ is then brought to a low logical level potential, rendering transistors Q1 and Q3 nonconductive, respectively, while selecting another word line.

Figure 5:
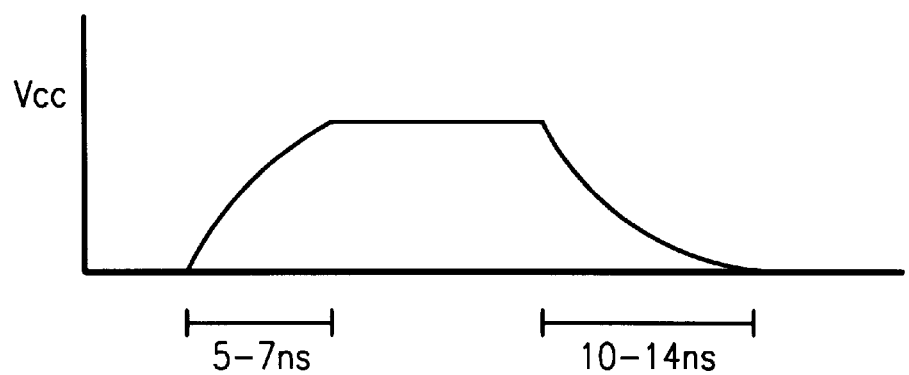
FIG. 5 is a word line voltage waveform of a conventional DRAM.
Figure 6:
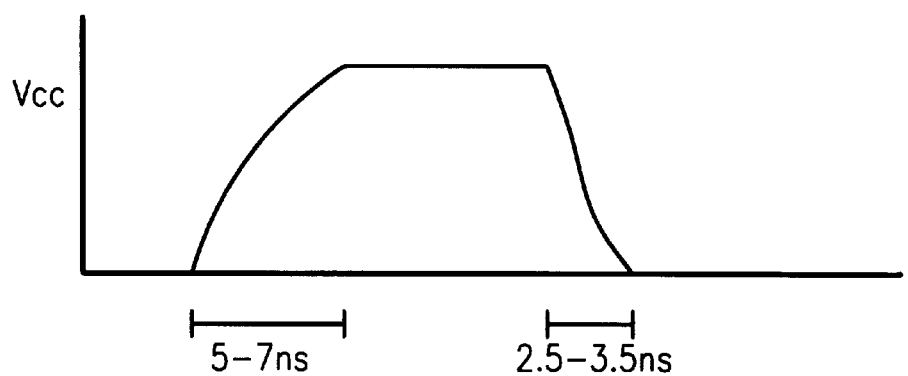
FIG. 6 is a word line voltage waveform of a DRAM in accordance with the present invention.

The advantages of the present invention will now be further described with reference to FIGS. 5 and 6, which illustrate word line voltage waveforms of a conventional DRAM and a DRAM in accordance with the present invention, respectively. As shown in FIG. 5, the conventional DRAM has a word line charge-up time of approximately 5–7 ns, and a row shut-off time of approximately 10–14 ns. In accordance with the present invention, while the time required to charge a word line up to Vcc is also approximately 5–7 ns, the row shut-off time is approximately 2.5 to 3.5 ns, significantly less than that of the conventional DRAM.

The improved row shut-off time can be achieved by providing two pull-down transistors at opposite ends of each word line, and driving their gates with the same universal phase signal. The two pull-down transistors have a simple construction and layout. Moreover, they occupy little real estate on the surface of the chip and do not require any additional masking steps.

It will be apparent to those skilled in the art that various modifications and variations can be made in the semiconductor memory of the present invention and in construction of this semiconductor memory without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor memory device comprising:
    a plurality of memory cells arranged in a row;
    a conductive line interconnecting said plurality of memory cells between first and second line end portions;
    a first switching device having a first terminal connected to said first line end portion of said conductive line, a second terminal for connection to a supply voltage, and a control terminal for receiving a control signal at a first potential to render said first switching device conductive, thereby coupling said conductive line to said supply voltage at said first line end portion; and
    a second switching device having a first terminal connected to said second line end portion of said conductive line, a second terminal for connection to said supply voltage, and a control terminal for receiving said control signal at said first potential to render said second switching device conductive, thereby coupling said conductive line to said supply voltage at said second line end portion.

2. A semiconductor memory device in accordance with claim 1, further comprising a buffer circuit coupled to charge said conductive line in response to said control signal being set to a second potential.

3. A semiconductor memory device in accordance with claim 2, further comprising a decoder circuit coupled to said buffer circuit, said decoder circuit receiving a combination of address bits, and, in response thereto, passing said control signal to said buffer circuit.

4. A semiconductor memory device in accordance with claim 1, wherein said conductive line is a conductive wiring layer including a polysilicon word line.

5. A semiconductor memory device in accordance with claim 1, wherein said first and second switching devices include MOS transistors.

6. A semiconductor memory device in accordance with claim 1, further comprising:
    another plurality of memory cells arranged in another row;
    another conductive line interconnecting said another plurality of memory cells, said another conductive line having first and second end portions adjacent said second and first end portions, respectively, of said conductive line;
    a third switching device having a first terminal connected to said first end portion of said another conductive line, a second terminal for connection to said supply voltage, and a control terminal for receiving said control signal; and a fourth switching device having a first terminal connected to said second end portion of said another conductive line, a second terminal coupled to said supply voltage, and a control terminal for receiving said control signal.

7. A semiconductor memory device in accordance with claim 6, wherein said conductive lines include polysilicon word lines.

8. A semiconductor memory device in accordance with claim 6, wherein said first to fourth switching devices include MOS transistors.

9. A method for driving a word line in a semiconductor memory array comprising the steps of:

coupling a first terminal of a first switching device to a first end portion of said word line and coupling a second terminal of said first switching device to a supply voltage;

coupling a first terminal of a second switching device to a second end portion of said word line and coupling a second terminal of said second switching device to said supply voltage;

supplying a control signal having a first potential to a control terminal of said first switching device and a control terminal of said second switching device, thereby cutting off said first and second switching devices;

supplying a voltage to said word line; and supplying said control signal having a second potential to said control terminals of said first and second switching devices, thereby discharging said word line through said first and second switching devices to said supply voltage.

10. A method for driving a word line in accordance with claim 9, wherein said first and second switching devices include MOS transistors.

11. A semiconductor memory device including a plurality of memory cells arranged in a plurality of rows, said semiconductor memory device comprising:

a plurality of word lines, each of which extends along a length of a respective one of said plurality of memory cell rows;

a plurality of first MOS transistors, each of which having a drain terminal connected to a first end portion of a respective one of said plurality of word lines and a source terminal for connection to a ground potential;

a plurality of second MOS transistors, each of which having a drain terminal connected to a second end portion of said respective one of said plurality of word lines and a source terminal for connection to said ground potential;

a plurality of buffer circuits, each of which having an output terminal connected to a respective one of said first end portions of said word lines;

a plurality of decoder circuits, corresponding in number to said plurality of word lines and connected to respective inputs of said buffer circuits; and a plurality of nodes for receiving control signals, each control signal coupled to a respective one of said buffer circuit inputs through a respective one of said decoder circuits, each of said plurality of control signal nodes being also connected to a respective gate terminal of each of said plurality of first and second MOS transistors, wherein, when said control signals are at a logic high level, said pluralities of first and second MOS transistors are rendered conductive to discharge said plurality of word lines to said ground potential.

12. A semiconductor memory device in accordance with claim 11, wherein each of said plurality of word lines includes polysilicon.

13. A memory array, comprising:

a plurality of memory cells;

an access line coupled to a first group of said memory cells;

a first switch assembly coupled to a first portion of said access line, said first switch assembly having a control node;

a second switch assembly coupled to a second portion of said access line which is spaced from said first portion, said second switch assembly having a control node; and a control signal line coupled to said control nodes of said first and second switch assemblies to provide a common control signal to said first and second switch assemblies, wherein each of said first and second switch assemblies includes a voltage terminal, said voltage terminals coupled to a common potential source, and wherein said first and second switch assemblies are coupled in parallel to one another.

14. A memory array, comprising:

a plurality of memory cells; an access line coupled to a first group of said memory cells;

a first switch assembly coupled to a first portion of said access line, said first switch assembly having a control node;

a second switch assembly coupled to a second portion of said access line which is spaced from said first portion said second switch assembly having a control node; and, a control signal line coupled to said control nodes of said first and second switch assemblies to provide a common control signal to said first and second switch assemblies, wherein said first switch assembly comprises a first MOS transistor having a first terminal connected to said first portion of said access line, a second terminal for connection to a supply voltage, and a control terminal coupled to said control node of said first switch assembly for receiving a control signal on said control signal line at a first potential to render said first MOS transistor conductive, thereby coupling said access line to said supply voltage at said first portion; and said second switch assembly comprises a second MOS transistor having a first terminal connected to said second portion of said access line, a second terminal for connection to a supply voltage, and a control terminal coupled to said control node of said second switch assembly for receiving a control signal on said control signal line at a first potential to render said second MOS transistor conductive, thereby coupling said access line to said supply voltage at said second portion.

15. A memory array in accordance with claim 14, further comprising a buffer circuit charging said access line in response to said common control signal being set to a second potential.

16. A memory array in accordance with claim 15, further comprising a decoder circuit coupled to said buffer circuit and said control signal line, said decoder circuit receiving a combination of address bits, and, in response thereto, passing said common control signal to said buffer circuit.

17. A memory array in accordance with claim 14, wherein said access line is a conductive layer including a polysilicon word line.

18. A memory array, comprising:
a plurality of memory cells;
an access line coupled to a first group of said memory cells;
a first switch assembly coupled to a first portion of said access line, said first switch assembly having a control node;
a second switch assembly coupled to a second portion of said access line which is spaced from said first portion, said second switch assembly having a control node;
a control signal line coupled to said control nodes of said first and second switch assemblies to provide a common control signal to said first and second switch assemblies;
another plurality of memory cells;
another access line coupled to a second group of said another plurality of memory cells;
a third switch assembly coupled to a first portion of said another access line, said third switch assembly having a control node; and
a fourth switch assembly coupled to a second portion of said another access line which is spaced from said first portion of said another access line, said fourth switch assembly having a control node, said control signal line coupled to said control nodes of said third and fourth switch assemblies,
wherein said third switch assembly comprises a first MOS transistor having a first terminal connected to said first portion of said another access line, a second terminal for connection to a supply voltage, and a control terminal coupled to said control node of said third switch assembly for receiving said common control signal on said control signal line at a first potential to render said first MOS transistor conductive, thereby coupling said another access line to said supply voltage at said first portion of said another access line, and
said fourth switch assembly comprises a second MOS transistor having a first terminal connected to said second portion of said another access line, a second terminal for connection to a supply voltage, and a control terminal coupled to said control node of said fourth switch assembly for receiving said common control signal on said control signal line at a first potential to render said second MOS transistor conductive, thereby coupling said another access line to said supply voltage at said second portion of said another access line.

19. A memory array in accordance with claim 18, further comprising a buffer circuit charging said another access line in response to said common control signal being set to a second potential.

20. A memory array in accordance with claim 19, further comprising a decoder circuit coupled to said buffer circuit and said common control signal line, said decoder circuit receiving a combination of address bits, and, in response thereto, passing said common control signal to said buffer circuit.

21. A memory array in accordance with claim 18, wherein said another access line comprises a polysilicon word line.

22. A method of operating a memory array having at least one access line coupled to a plurality of memory cells, comprising the steps of:
selectively coupling, in response to a single signal, said access line to a selected potential node at at least two spaced locations along said access line; and
selectively establishing parallel paths between said access line and said selected potential node by said selective coupling.

23. A method in accordance with claim 22, wherein said selectively establishing step comprises establishing said parallel paths at respective said at least two spaced locations.

24. A method in accordance with claim 22, wherein said selectively coupling step includes the steps of:
applying a control signal to control terminals of a plurality of switching elements; and
rendering said plurality of switching elements conductive in response to said control signal, said switching elements respectively connected between said access line at said at least two spaced locations and said selected potential node.

25. A semiconductor memory device comprising:
a plurality of memory cells arranged in a row;
a conductive line interconnecting said plurality of memory cells between first and second line end portions;
at least one switching device having a first terminal connected to said first line end portion of said conductive line, a second terminal for connection to a supply voltage, and a control terminal for receiving a control signal at a first potential to render said first switching device conductive,
at least one additional switching device having a first terminal connected to said second line end portion of said conductive line spaced from said first line end portion, a second terminal for connection to a supply voltage, and a control terminal receiving a control signal at said first potential to render said additional switching device conductive,
said control signal coupling said conductive line to said supply voltages at said first and second line end portions and thereby decreasing a shut-off time of said conductive line.

26. The semiconductor memory device of claim 25, wherein the supply voltage is ground.

27. The semiconductor memory device of claim 25, wherein the first switching device comprises a MOS transistor.

28. The semiconductor memory device of claim 25, wherein the shut-off time is decreased by approximately 75%.

29. The semiconductor memory device of claim 25, wherein the conductive line is a word line.

* * * * *